(12) United States Patent
Anegawa

(10) Patent No.: US 10,469,031 B2
(45) Date of Patent: Nov. 5, 2019

(54) ENVELOPE DETECTING CIRCUIT

(71) Applicant: SUMITOMO ELECTRIC INDUSTRIES, LTD., Osaka (JP)

(72) Inventor: Osamu Anegawa, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/289,171

(22) Filed: Feb. 28, 2019

(65) Prior Publication Data

US 2019/0199292 A1 Jun. 27, 2019

Related U.S. Application Data

(62) Division of application No. 15/789,553, filed on Oct. 20, 2017.

(30) Foreign Application Priority Data

Oct. 20, 2016 (JP) ................. 2016-205847

(51) Int. Cl.
| | |
|---|---|
| *H03F 3/193* | (2006.01) |
| *H04B 1/16* | (2006.01) |
| *H03F 3/45* | (2006.01) |
| *H03F 1/02* | (2006.01) |
| *G01R 19/04* | (2006.01) |

(52) U.S. Cl.
CPC .......... *H03F 1/0205* (2013.01); *G01R 19/04* (2013.01); *H03F 3/193* (2013.01); *H03F 2200/06* (2013.01); *H03F 2200/102* (2013.01); *H03F 2200/171* (2013.01); *H03F 2200/225* (2013.01); *H03F 2200/255* (2013.01); *H03F 2200/451* (2013.01)

(58) Field of Classification Search
USPC ............ 330/301–302, 295, 124 R, 285, 296
See application file for complete search history.

(56) References Cited

U.S. PATENT DOCUMENTS

| | | | | |
|---|---|---|---|---|
| 4,319,196 | A | * | 3/1982 | Kwan ...................... H03D 1/10 329/352 |
| 7,183,846 | B2 | | 2/2007 | Cristaudo et al. |
| 7,656,229 | B2 | | 2/2010 | Deng et al. |
| 7,679,448 | B1 | | 3/2010 | McAdam et al. |
| 8,019,292 | B2 | * | 9/2011 | Magoon ............... H03G 3/3047 455/126 |
| 2008/0305760 | A1 | * | 12/2008 | Meltzer .................... H03D 1/18 455/334 |

FOREIGN PATENT DOCUMENTS

JP         2000-068747       3/2000

* cited by examiner

*Primary Examiner* — Hieu P Nguyen
(74) *Attorney, Agent, or Firm* — Smith, Gambrell & Russell, LLP

(57) ABSTRACT

An envelope detecting circuit is for generating an envelope signal of an input RF signal as described. The envelope detecting circuit includes an input terminal, an output terminal, a balun, a transistor, and an integrating circuit. The transistor, which is operated in the class B or the class C mode, receives an input signal from the balun, amplifies the input signal, and outputs an amplified signal. The integrating circuit, which is provided between the transistor and the output terminal, provides a series circuit of a resistor and a capacitor between the bias supply and ground. The transistor receives the bias through the resistor. The capacitor holds bottom levels of the amplified signal.

5 Claims, 6 Drawing Sheets

ENVELOPE DETECTING CIRCUIT

This application is a division of U.S. application Ser. No. 15/789,553 filed on Oct. 20, 2017 and incorporates said application Ser. No. 15/789,553 in its entirety herein.

BACKGROUND OF THE INVENTION

1. Field of the Invention

The present invention relates to an envelope detecting circuit that may generate an envelope signal of an input radio-frequency (RF) signal.

2. Related Background Art

It has been known that an envelope detecting circuit implements an active element such as a field effect transistor (FET) where an FET is operable as a diode. A Japanese Patent Application laid open No. JP-2000-068747A has disclosed such an envelope detecting circuit. However, when a transistor, which is a three-terminal device, is used as a diode, which is a two-terminal device, the transistor used therein shows no function to amplify an input signal, which results in a restricted output power.

SUMMARY OF THE INVENTION

An aspect of the present invention relates to an envelope detecting circuit that includes an input terminal, an output terminal, a transistor, and an integrating circuit. The input terminal receives an input radio-frequency (RF) signal. The output terminal outputs an envelope signal of the input RF signal. The transistor receives the input RF signal in a control terminal thereof from the input terminal, amplifies thus received input RF signal, and outputs an amplified signal in one of current terminals. This one of the current terminals is connected with the output terminal. The integrating circuit is provided between the transistor and the output terminal, The integrating circuit includes a resistor and a capacitor connected in series between a bias supply and a ground. The transistor receives a bias in the one of the current terminals from the bias supply through the resistor. A feature of the envelope detecting circuit of the preset invention is that the transistor is operated in the class B mode or the class C mode.

Another envelope detecting circuit of the present invention provides an input terminal, an output terminal, a balun, and two envelope detecting units. The input terminal receives an input RF signal. The output terminal outputs an envelope signal of the input RF signal. The balun receives the input RF signal from the input terminal and generates two input signals complementary to each other. The two envelope detecting units each receive the input signals from the balun and coupling the envelope signals generated therein in the output terminal. The envelope generating units each provide a transistor and an integrating circuit. The transistor receives the input signal from the balun, amplifies the input signal, and outputs thus amplified signal in one of the current terminals thereof that is connected with the output terminal. The transistor is operated in the class B or the class C mode. The integrating circuit, which is provided between the transistor and the output terminal, includes a resistor and a capacitor connected in series between a bias supply and a ground. The transistor is biased in the one of the current terminal thereof by the bias supply through the resistor.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to accompanying drawings. In the description of the drawings, numerals or symbols same with or similar to each other will refer to elements same with or similar to each other without duplicating explanations.

First Embodiment

Figure 1:
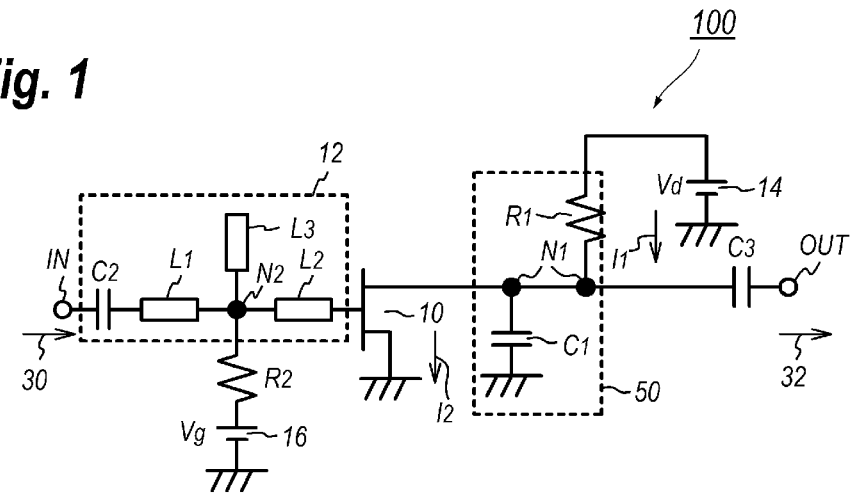
FIG. 1 shows a circuit diagram of an envelope detecting circuit according to the first embodiment of the present invention.

FIG. 1 shows a circuit diagram of an envelope detecting circuit according to the first embodiment of the present invention. The envelope detecting circuit 100 provides a field effect transistor (FET) 10 whose gate is connected to an input terminal IN thorough an input matching circuit 12 that includes a capacitor $C_2$ and distributed transmission lines, $L_1$ to $L_3$. Provided between the input terminal IN and the gate of the FET 10 is a series circuit of the capacitor $C_2$ and two distributed transmission lines, $L_1$ and $L_2$. The distributed transmission line $L_3$ is connected as an open stub between two distributed transmission lines, $L_1$ and $L_2$, which is denoted as a node $N_2$. The capacitor $C_2$ may operate as a coupling capacitor to cut a DC component. The input matching circuit 12 may match input impedance of the FET 10 with transmission impedance of an external circuit that is not illustrated in figures. That is, the matching circuit 12 makes input impedance of the envelope detecting circuit 100 viewed from the input terminal IN to be matched with the transmission impedance of the external circuit.

A power supply 16 may provide gate bias of the FET 10 through a resistor $R_2$, the node $N_2$, and the distributed transmission line $L_2$. The resistor $R_2$ may prevent high frequency components from leaking to the power supply 16.

The FET 10 in a source thereof is grounded, and a drain is connected with an output terminal OUT through a capacitor $C_3$ that is also operable as a coupling capacitor to cut a DC component. A voltage $V_d$ is supplied to a node $N_1$ between the FET 10 and the output terminal OUT from a voltage source 14 through a resistor $R_1$. This node $N_1$ is also grounded through a capacitor $C_1$. The resistor $R_1$ and the capacitor $C_1$ forms an integration circuit 50 with a time constant. The input terminal IN receives a radio-frequency (RF) signal 30 in a submillimeter band and/or a millimeter band, while, the output terminal OUT outputs an envelope signal 32 of this input RF signal 30.

The resistors, $R_1$ and $R_2$, have resistance of 400Ω and 1 kΩ, the capacitors, $C_1$ to $C_3$, have capacitance of 0.485 pF, 0.453 pF, and 2.2 µF, respectively, and the distributed transmission lines, $L_1$ to $L_3$, have electrical lengths of 0.00595λ, 0.0923λ, and 0.0893λ, where λ is a wavelength of an input RF signal subject to the present envelope detecting circuit 100. The FET 10 receives a drain bias $V_d$ of 2 V and a gate bias $V_g$ of 0 V.

Operation of Envelope Detecting Circuit

Figure 2:
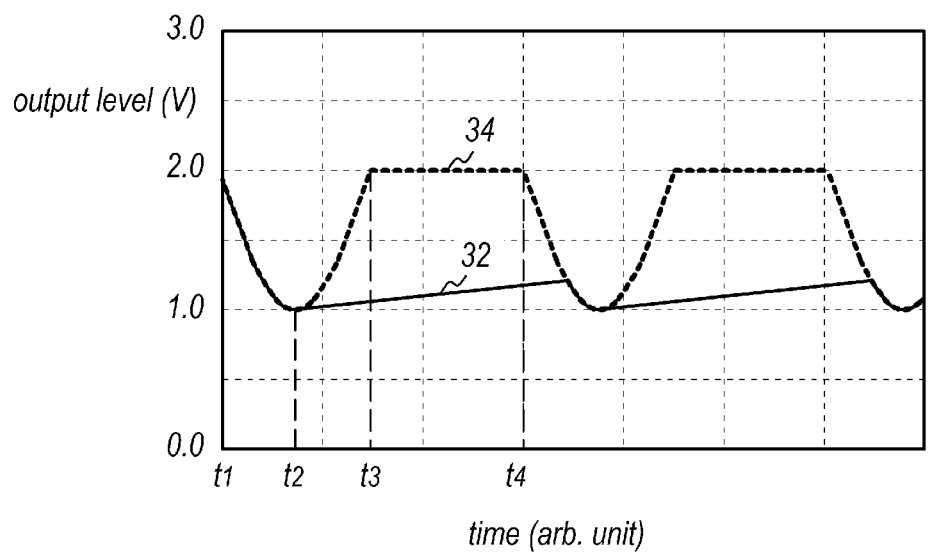
FIG. 2 compares signal forms of the envelope detecting circuit having the integrating circuit with that without the integrating circuit.

FIG. 2 schematically shows an output signal form of the FET 10 when the FET 10 is biased in the class B mode, that is, the FET 10 turns off for no input signal. Also, the FET 10 is further preferably biased in the class C mode at which the FET 10 is further deeply biased compared with the class B mode, that is, a period the FET 10 is turned off in the class C mode becomes longer compared with a status when the FET 10 is biased in the class B mode. As shown in FIG. 2, when the input RF signal 30 is 0 at $t_1$, the output of the FET 10, namely, a drain level of the FET 10 becomes equal to the drain bias $V_d$ because the FET 10 is turned off and no drain current $I_2$ flows therein. Thereafter, when the input RF signal 30 gradually increases from $t_1$ to $t_2$, the FET 10 gradually turns on, the drain current $I_2$ thereof increases, and carriers stored in the capacitor $C_1$ discharge as the drain current $I_2$.

Thereafter, the input RF sisal 30 gradually decreases from $t_2$ to $t_3$, the drain current $I_2$ decreases, during which the voltage source 14 continuously supplies the current $I_1$ to the node $N_1$, which is going to keep a voltage drop caused in the resistor $R_1$, that is, the node $N_1$ is going to lower the level thereof, however, a portion of the current $I_1$ flows in the capacitor $C_1$ and charges thereof. Accordingly, the node $N_1$ in the level thereof is substantially unchanged from the level at $t_2$.

From $t_3$ to $t_4$, the input RF signal 30 becomes less than 0 V, which turns off the FET 10 and cuts the drain current $I_2$, the current $I_1$ flows in the resistor $R_1$ depending on a voltage difference between the level at the node $N_1$ and the voltage $V_d$ of the bias supply 14 and the time constant defined by a product of the resistance of the resistor $R_1$ and the capacitance of the capacitor $C_1$. Setting the time constant longer than a period of the input RF signal 30, the node $N_1$ in the voltage level thereof becomes gradually increases because the capacitor $C_1$ is charged through the resistor $R_1$. Thus, the level at the node $N_1$ substantially reflects the envelope of the signal amplified by the FET 10.

According to the first embodiment, the FET 10, which operates in the class B mode, receives the input RF signal 30 in the control terminal thereof. The FET 10 is ground in the source thereof and the drain is connected with the output terminal OUT through the capacitor $C_3$. Provided between the FET 10 and the output terminal 10 is the integrating circuit 50 that includes the resistor $R_1$ and the capacitor $C_1$ connected in series between the bias source 14 and the ground. The FET 10 in the drain thereof is biased by the bias source 14 through the resistor $R_1$, while, it is grounded through the capacitor $C_1$.

According to the configuration above, the envelope detecting circuit 100 may detect the envelope of the input RF signal 30 but amplified by the FET 10, Because the FET 10 may inversely amplify the input RF 30, the output of the envelope detecting circuit 100 may secure the output power therefrom. When the input RF signal 30 is in the submillimeter band, or the millimeter band, various reasons, such as impedance mismatching and/or losses in transmission lines, may increase signal losses, an envelope detecting circuit is strongly requested to suppress or compensate losses in the output thereof.

The envelope detecting circuit 100 of the embodiment preferably has a greater time constant to charge the capacitor $C_1$ by the current $I_1$ in order to form the envelope signal. The time constant for charging the capacitor $C_1$ may be primarily determined by a product of the resistance of the resistor $R_1$ with the capacitance of the capacitor $C_1$; and the time constant in the present embodiment is preferably twice of a period of the input RF signal 30, or further preferably five times greater than the period of the input RF signal 30.

Figure 3A:
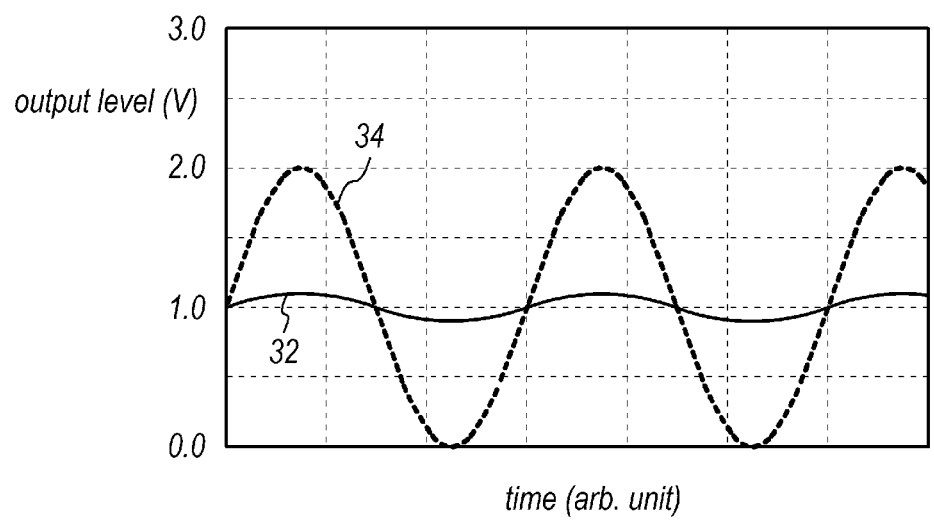
FIG. 3A shows a signal form of an envelope detecting circuit when a transistor is operated in the class A mode.
Figure 3B:
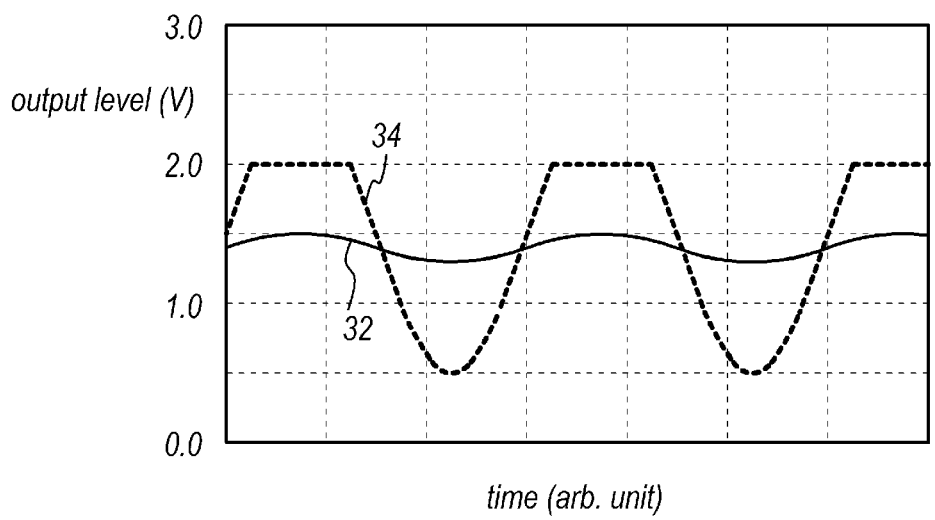
FIG. 3B shows a signal form of an envelope detecting circuit when a transistor is operated in the class AB mode.

FIGS. 3A and 3B schematically illustrates operations of the FET 10 in the class A, FIG. 3A, and in the class AB, FIG. 3B. In the class A mode, the FET 10 never turns off, which means that the output of the FET 10 without the integrating circuit 50 becomes a sine curve. Thus, the FET 10 always flows the current $I_2$ in the class A mode, which sets the output signal in an average thereof to be half of the bias, namely, $V_d/2$. Also, the output signal becomes a sine wave but amplitude thereof is attenuated because of the existence of the capacitor $C_1$. Thus, the transistor operating in the class A mode may not detect the envelope of the input RF signal 30.

When the FET 10 is operated in the class AB mode, the transistor may turn off but a period thereof is shorter compared with the case of the class B or the class C mode. The charge stored in the capacitor $C_1$ may discharge through the FET 10 when the FET 10 turns on, which reduces the current $I_1$ flowing in the resistor $R_1$ and raises the level at the node $N_1$. Thus, the class AB mode suppresses the amplitude of the output envelope signal.

Second Embodiment

Figure 4:
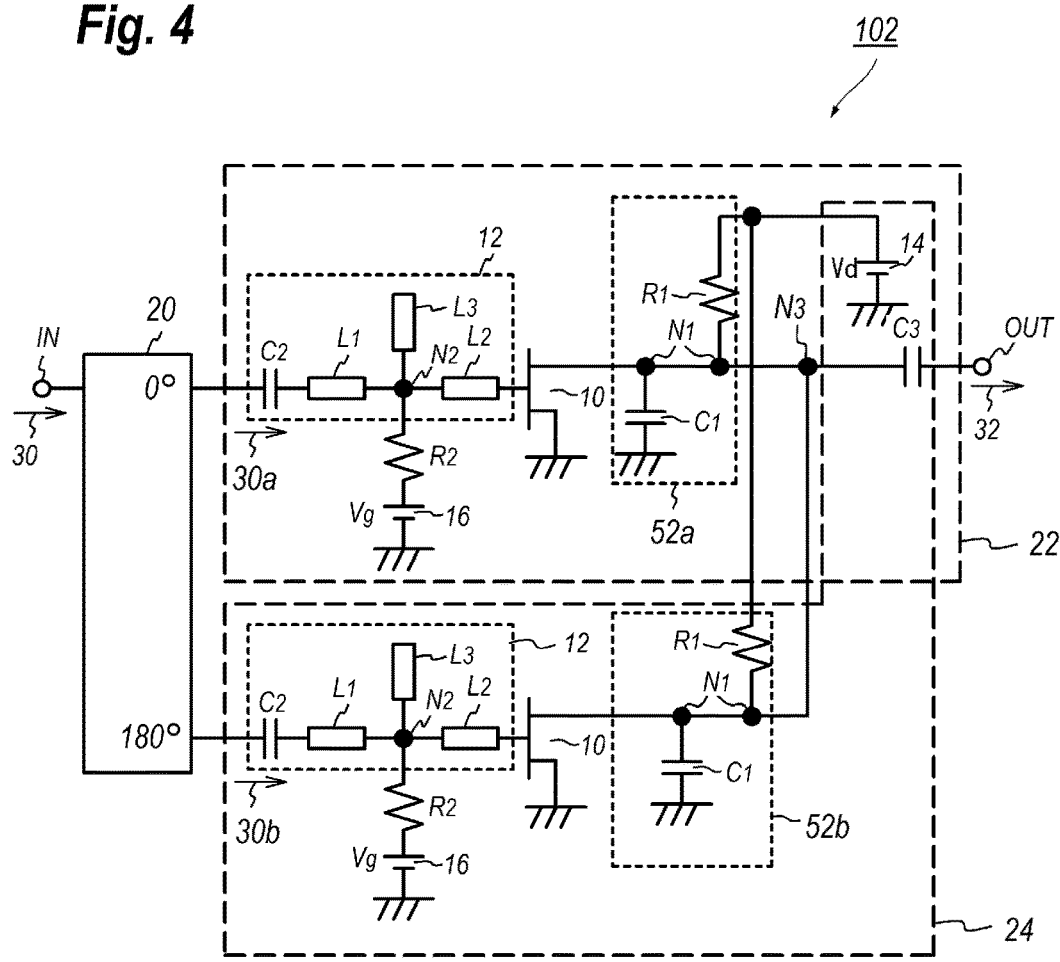
FIG. 4 shows a circuit diagram of another envelope detecting circuit according to the second embodiment of the present invention.

FIG. 4 shows a circuit diagram of another envelope detecting circuit according to the second embodiment of the present invention. The envelope detecting circuit 102 includes a balun 20 and two envelope detecting units, 22 and 24. The balun 20 generates two signals complementary to each other by receiving the input RF signal 30 from the input terminal IN. The envelope detecting units, 22 and 24, have configurations the same as that shown in FIG. 1, where the integration circuit 52a in the former envelope detecting unit 22 includes the series circuit of the resistor $R_1$ and the capacitor $C_1$, while, that in the latter envelope detecting unit 24 also includes the series circuit of the resistor $R_1$ and the capacitor $C_1$. That is the integration circuits, 52a and 52b, have the same time constant. The outputs of the two envelope detecting units, 22 and 24, namely, the drains of the respective FETs 10, are coupled with the node $N_3$ and the coupling capacitor $C_3$ connected with the output terminal OUT is commonly owned by the two envelope detecting units, 22 and 24. The envelope signals generated in the respective detecting units, 22 and 24, are merged at the node $N_3$ and output from the output terminal OUT as the envelope signal 32. Details of the two envelope detecting units, 22 and 24, namely, the operation of the two envelope detecting units, 22 and 24, are the same as that shown in FIG. 1. One of the outputs 30a of the balun 20 enters the gate of the FET 10 in the first envelope detecting unit 22, while, the other of the outputs 30b enters the gate of the FET 10 in the other envelope detecting unit 24, each through the input matching unit 12.

Figure 5:
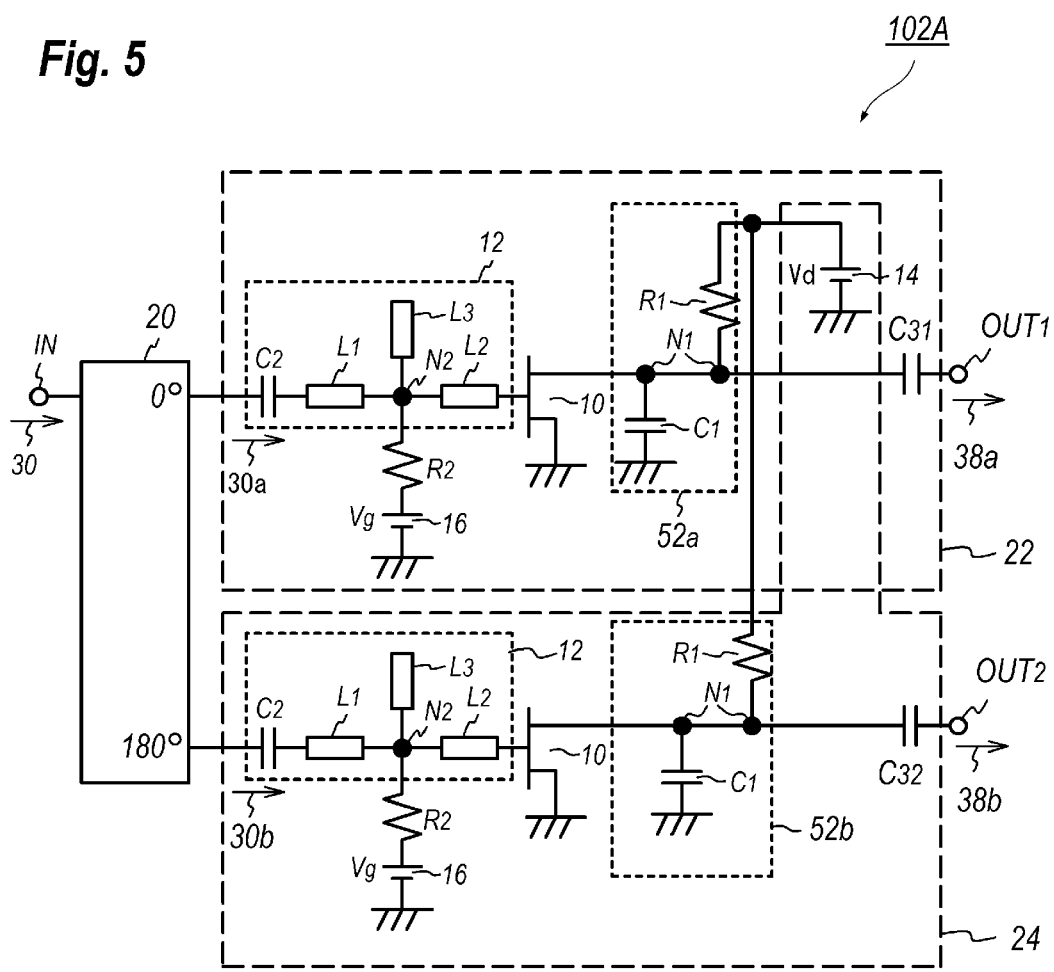
FIG. 5 shows a circuit diagram of still another envelope detecting circuit that is modified from the envelope detecting circuit shown in FIG. 4.

FIG. 5 shows a circuit diagram of an envelope detecting circuit 102A modified from that shown in FIG. 4. The circuit 102A of FIG. 5 has a feature distinguishable from that shown in FIG. 4 that the outputs of the respective envelope detecting units, 22 and 24, are independently provided to the output terminals, $OUT_1$ and $OUT_2$. That is, the envelope detecting units 22 may generate the first output in the terminal $OUT_1$ through the coupling capacitor $C_{31}$ as the first envelope signal 38a; while, the other envelope detecting units 24 may also generate the second output in the terminal $OUT_2$ through the coupling capacitor $C_{32}$ as the second envelope signal 38b.

Operation of Envelope Detecting Circuit in the Second Embodiment

Figure 6A:
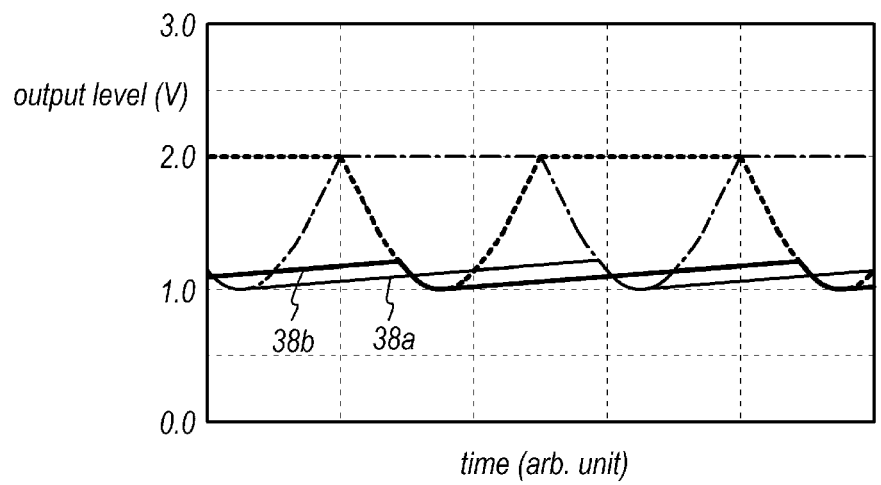
FIG. 6A compares signal forms of the envelope signals output from the circuit shown in FIG. 4 with that output from the circuit shown in FIG. 5, and FIG. 6B magnifies the envelope signals shown in FIG. 6A.
Figure 6B:
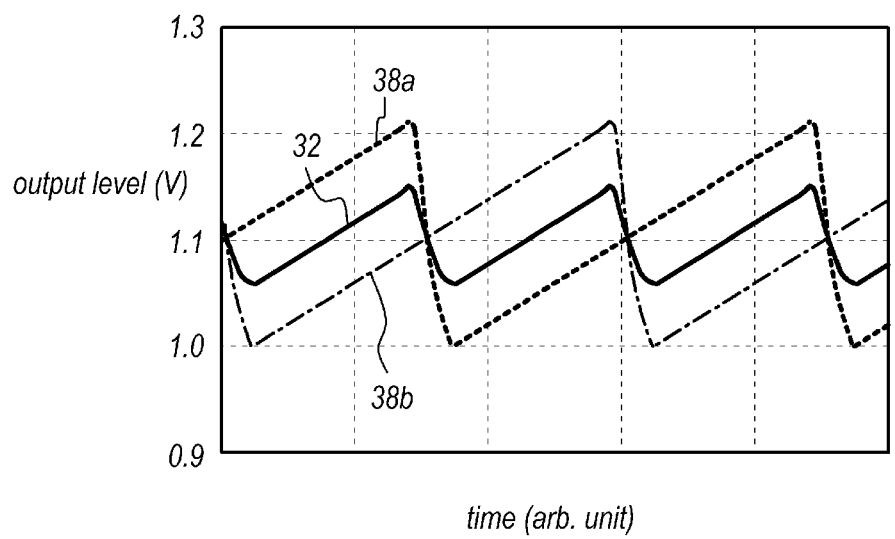

FIG. 6A schematically illustrates the envelope signals, 38a and 38b, output from the respective detecting units, 22 and 24, shown in FIG. 5. Because the respective detecting units, 22 and 24, provides the integration circuits, 52a and 52b, in the drains of the FET 10, the detecting units, 22 and 24, may generate the envelope signals, 38a and 38b, with the phase difference of π. The envelope detecting circuit 102 of the second embodiment may combine these two envelope signals, 38a and 38b, at the node $N_3$, the output of the envelope detecting circuit 102 becomes that 32 shown in FIG. 6B, that is, the output 32 of the envelope detecting circuit 102 becomes an average of the two outputs, 38a and 38b. The output 32 primarily contains a frequency component that is twice of the frequency component of the input RF signal 30 and the fluctuation appearing in the output becomes half of those, 38a and 38b, for a case that the envelope detecting function is carried out in the single phase by the circuit shown in FIG. 1. The fluctuation appearing in the output is sometimes called as a ripple.

According to the second embodiment, the balun 20 may generate two signals, 30a and 30b, complementary to each other from the input RF signal 30 each provided to the detecting units, 22 and 24. The envelope detecting units, 22 and 24, have arrangements same with each other, that is, the envelope detecting units, 22 and 24, include the FET 10 and the integration circuit comprising the resistor $R_1$ and the capacitor $C_1$ connected in series between the bias source 14 and the ground, and coupled with the drain of the FET 10. Accordingly, the envelope detecting circuit 102 may generate an envelope signal with a primary frequency component that is double of the primary frequency component of the input RF signal 30. The FET 10 in the respective envelope detecting units, 22 and 24, may be preferably operated in the class B mode, or further preferably in the class C mode. The time constant of the integrating circuit, 52a and 52b, is preferably greater than a period of the input RF signal 30.

The description above concentrates in the arrangement where the envelope detecting circuits, 100, 102, and 102A, provides a field effect transistor (FET) as an amplifying element. However, the amplifying element is not restricted to an FET, a bipolar transistor and the like may be implemented in the envelope detecting circuits, 100, 102, and 102A.

Third Embodiment

Figure 7:
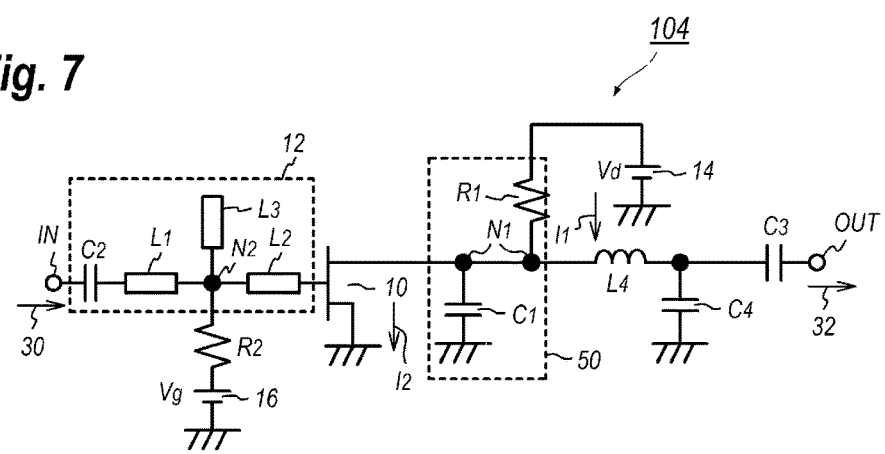
FIG. 7 shows a circuit diagram of an envelope detecting circuit according to the third embodiment of the present invention.

FIG. 7 shows a circuit diagram of an envelope detecting circuit according to the third embodiment of the present invention. The envelope detecting circuit 104 shown in FIG. 7 has a feature distinguishable from those of the aforementioned embodiment is that the circuit 104 provides a filter between the integrating circuit 10 and the output terminal OUT. The filter includes an inductor $L_4$ and a capacitor $C_4$, that is, the filter operates as a low-pass filter, or a high-cut filter. Although the envelope signal generated by the envelope detecting circuits, 100 to 104, contains high frequency components including a primary frequency component of the input RF signal 30 and a frequency component double of the primary frequency component in the envelope detecting circuit 102 of the second embodiment, the primary frequency component of the envelope signal to be utilized is low frequency far lower than the primary frequency component of the input RF signal 30. The filter disposed in the output of the FET 10 may effectively eliminate high frequency components and make the envelope signal stable enough.

While, particular embodiment of the present invention has been described herein for purposes of illustration, many modifications and changes will become apparent to those skilled in the art. Accordingly, the appended claims are intended to encompass all such modifications and changes as fall within the true spirit and scope of this invention.

The present application claims the benefit of priority of Japanese Patent Application No. 2016-205847, filed on Oct. 20, 2016, which is incorporated herein by reference.

I claim:

1. An envelope detecting circuit comprising:
an input terminal that receives an input radio-frequency (RF) signal;
an output terminal that outputs an envelope signal of the input RF signal;
a balun that receives the input RF signal from the input terminal and generates two input signals complementary to each other; and
two envelope detecting units each receiving the input signals from the balun and generating an envelope signal in the output terminal,
wherein the envelope detecting units each provide
a transistor that receives one input signal from the balun, amplifies the input signal, and outputs an amplified signal in a current terminal that is connected with the output terminal, the transistor being operated in a class B or a class C mode,
an integrating circuit provided between the transistor and the output terminal, the integrating circuit including a resistor and a capacitor connected in series between a bias supply and ground, the transistor being biased in the current terminal by the bias supply through the resistor.

2. The envelope detecting circuit of claim 1,
wherein the integrating circuit has a time constant greater than a period of the input RF signal.

3. The envelope detecting circuit of claim 1,
wherein the transistor in the envelope detecting units is operated in the class C mode.

4. The envelope detecting circuit of claim 1,
further including a low-pass filter provided between the transistor and the output terminal, the low-pass filter eliminating a primary frequency component of the input RF signal and a double of the primary frequency component.

5. The envelope detecting circuit of claim 4,
wherein the low-pass filter includes a capacitor.

* * * * *